United States Patent [19]

Eloise-Pillerault et al.

[11] Patent Number: 4,860,365

[45] Date of Patent: Aug. 22, 1989

[54] METHOD OF FRACTIONATING THE SOUND RESTORATION OF MODULATED SIGNALS IN PARALLEL MOUNTED TRANSDUCERS, AND SETS OF CORRESPONDING TRANSDUCERS

[76] Inventors: Clement Eloise-Pillerault, 8 a 10, rue du Plateau, 94700 Maisons-Alfort; Claude Benoit; Vincent Benoit, both of 11, rue de Lorraine, 92600 Asnieres, all of France

[21] Appl. No.: 110,938

[22] Filed: Oct. 21, 1987

[30] Foreign Application Priority Data

Oct. 21, 1986 [FR] France .............................. 86 14583

[51] Int. Cl.[4] .......................... H03G 5/00; H04R 1/02

[52] U.S. Cl. .......................................... 381/90; 381/99; 381/159; 181/145

[58] Field of Search ..................... 381/191, 98, 99, 90, 381/100, 103, 24, 10, 159, 111; 181/146, 151, 144, 145, 175

[56] References Cited

U.S. PATENT DOCUMENTS 4,270,023 5/1981 Beveridge .......................... 381/191

4,633,501 12/1986 Werrback .......................... 381/100

*Primary Examiner*—Jin F. Ng

*Assistant Examiner*—David H. Kim

*Attorney, Agent, or Firm*—Kenyon & Kenyon

[57] ABSTRACT

The invention relates to a method for selectively restoring a sound signal delivered by an electric source in several parallel mounted transducers, each transducer being specialized for restoring a frequency range of the spectrum of the signal. The method consists more precisely in permanently fractionating the sound signal into frequencies so as to assign each component to the transducer optimized for the corresponding frequency range, without using any additional selection circuit such as filtering circuits.

15 Claims, 4 Drawing Sheets

METHOD OF FRACTIONATING THE SOUND RESTORATION OF MODULATED SIGNALS IN PARALLEL MOUNTED TRANSDUCERS, AND SETS OF CORRESPONDING TRANSDUCERS

BACKGROUND OF THE INVENTION

The invention relates to a method for selectively restoring a sound signal delivered by an electric source in several parallel mounted transducers, each transducer being specialized for restoring a frequency range of the spectrum of the signal. The method consists more precisely in permanently fractionating the sound signal into frequencies so as to assign each component to the transducer optimized for the corresponding frequency range, without using any additional selection circuit such as filtering circuits or others.

The invention also relates to all the associated sets of transducers for implementing the method.

DESCRIPTION OF RELATED INFORMATION

In the restoration of sound signal by electroacoustic transducers, especially transducers formed of at least a loud speaker coupled to an acoustic load, for example a resonating enclosure, it is always advantageous to use several loudspeakers, each specialized for restoring a band of the sound spectrum. In fact, the restoration of an audible sound signal in the maximum range of 20 Hz to 20,000 Hz for example implies that the loudspeaker must satisfy contradictory characteristics of response time and of movement of the mobile part, which vary from one end of the sound spectrum to the other. Breaking up of the spectrum into several bands avoids attenuation of the components of the spectrum situated at the ends.

Generally, in high fidelity systems, three parallel channels are provided corresponding to the lower frequencies, to the medium frequencies and to the high frequencies.

The techniques used up to now for obtaining fractionation of the frequencies are based on the design and construction of the transducers, on the one hand, and the processing of the electric signal upstream of the transducer. Techniques are known which consist:

in simply using the limiting effects of the frequencies resulting from the intrinsic characteristics of the particular methods of constructing the transducers (example: certain loudspeakers called "boomers");

the addition of special circuits upstream of the transducer, such as active or passive filtering circuits;

the association with the loudspeaker of acoustic loads introducing a factor of selectivity.

Now, these known methods have in particular three major types of drawbacks which adversely affect the efficiency of the electro-acoustic transducers and consequently the quality in restoring the sound signal.

First of all, the use of filtering circuits results in power losses of the signal which must be compensated for by an increased amplification. This adversely affects then the overall efficiency of the installation and implies the use of components working at high power, with increased requirements of quality so as to avoid distortion. In addition, the filters themselves are a factor of distortion of the signal, because of the impossibility of conferring thereon a perfectly linear transfer subject to variations of their response characteristic as a function of the ambient temperature, or even of their aging.

Secondly, the implicit rules adopted up to now in the restoration of high fidelity sound signals have led to orienting the design of electro-acoustic loudspeaker enclosures in a direction which more and more affects their efficiency.

In fact, the efficiency of an electro-dynamic loudspeaker is expressed in the form:

$$= \frac{8R_i\,(p/2nv)\,(Bl)^2}{(M/S)^2\,(z_e + R_i)^2}$$

with

B induction in the coil

M total dynamic mass of the mobile system

S section of the piston $Z_e$ electric impedance of the mobile coil l total length of the wire used to form the mobile coil v speed of movement of the membrane p voluminal mass of the membrane $R_i$ internal impedance of the source.

The interpretation of this theoretical result is always difficult, because certain conditions remain contradictory. We may say for the sake of simplicity that up to now the choice is almost unanimously made of maximizing the product Bl, by arguing that the value of this product varies in the same direction as the efficiency, and that its increase results in a high damping favorable to a good response in transitory conditions.

Now, maximization of product Bl is not neutral with respect to the electric impedance $Z_e$ of the mobile coil which unfavorably influences the efficiency. This impedance is in fact related to the length of wire l.

Furthermore, particularly in the low frequency range, the conditions of use of loudspeakers lead, for some frequencies, to making the mobile assembly of the loudspeaker movable over a relatively large distance, which increases the length of the mobile coil and so indirectly its impedance $Z_e$.

The third type of drawback inherent in existing systems is relative to the response curve of the "enclosure+loudspeaker" assemblies at present constructed, The typical form of this response curve is shown in FIG. 1, curve A. It can be seen that from 50Hz the level of restoring the frequencies is naturally uneven before stabilizing approximately about 100 Hz. Up to now, the correction means used for linearizing this response curve consists generally in adjusting the characteristics of the vent or similar, in heavily damping the parasite acoustic phenomena of the enclosure, for example by packing its internal wall with a "smothering" material (glass wool), or else in adjusting the parameters of the loudspeaker (particularly QTS and VAS in accordance with the Thiele and Small methods). Now, it can be seen from the response curve B of the transducer obtained that these known techniques lower, at least for the low frequencies, the level of the sound power restored by the transducer: this attenuation reaches more than 5dB which is considerable.

Linearization of the response curve of the loudspeaker, using these techniques, leads then to greatly reducing the efficiency of the loudspeaker and enclosure assembly, with the corresponding drawbacks already mentioned above.

A "loudspeaker system for high quality sound reproduction" is already know, such as described in the German patent DE-35 06 139 granted on the 5th June 1985 to Mr. LUDENDORFF. This system consists in connecting in parallel several loudspeakers each having a capacitor matched to the resonance frequency of the associated loudspeaker. This prior system results, because of the presence of the capacitors, in reducing the efficiency of the transducers by damping out certain frequencies.

An acoustic enclosure system is also known such as described in the French patent application 77 06227 filed on the 3 March 1977 in the name of the firm MERCURIALE SPECIFIQUE ACOUSTIQUE. The object of the system described in this prior document is to regularize the response curve of a loudspeaker mounted in an acoustic enclosure, particularly using mechanical means for decompression of the membrane of the loudspeaker associated with an electric resonator. Here again, the proposed configuration consists in damping out the response of the transducer at the level of the resonance frequency, and so in reducing the efficiency thereof.

OBJECTS OF THE INVENTION

The object of the present invention is to overcome these different drawbacks of existing devices.

More precisely, a first object of the invention is to provide a method of fractionating an acoustic signal between several transducers, without any circuit or additional load so as to reduce cost and increase reliability.

A second object of the invention is to provide such a method for optimizing the use of each transducer by causing it to restore only the components of the sound signal situated within a given frequency range where it dissipates minimum power.

This optimum operating zone also corresponds to minimum displacement of the mobile assembly of each loudspeaker and produces relative homogeneuity over the whole of its working frequency range (FIG. 3.).

Another object of the invention is to provide a method for choosing among the different transducers mounted in parallel of a given set so as to restore the sound signal so that each is effectively optimized.

SUMMARY OF THE INVENTION

These objects as well as others which will appear hereafter are attained by a method for the sound restoration of electric signals using electro-acoustic transducers, particularly of the type formed by at least one loudspeaker mounted in a resonating enclosure and intended to be connected to the output of an electric source. This method comprises connecting at least two transducers in parallel across said source without requiring the use of additional selection or correction filters. The choice of the transducers thus coupled is made so as to cause each of them to operate selectively in a given frequency range. The working frequency ranges of the transducers is juxtaposed so as to cover the whole range of the sound signal to be restored. Each component of said signal is selectively restored essentially as a function of its frequency (f) in the transducer working in the corresponding frequency range because the transducer has minimum impedance in this range.

Advantageously, the loudspeaker and the resonating enclosure are chosen for each transducer so that the working frequency range assigned to this transducer corresponds to a minimum impedance zone for this transducer with respect to the impedance offered by the other transducers in the same range. The complete set of transducers connected in parallel to the source are formed from at least two transducers whose respective minimum impedance zones are juxtaposed in frequency.

DETAILED DESCRIPTION OF THE INVENTION

The fractionating principle of the invention is based on the new idea of specializing the operation of each transducer in a limited range of the frequency spectrum for which both the fidelity of sound restoration is the highest in the transducer considered and the routing of the frequencies is automatically made to each transducer.

This method is attained when two conditions are fulfilled:

first, each transducer must have a minimum impedance zone over the extent B of the total spectrum of the sound signal to be restored.

In low frequencies, the significant component of the impedance is this kinetic impedance Zem, this kinetic impedance is related to the displacement of the mobile assembly of the loudspeaker mounted in its enclosure.

The invention consists in choosing the loudspeaker and its enclosure so as to cause a high acoustic overcoupling between the loudspeaker and the enclosure. This is obtained in particular by coupling an loudspeaker and an enclosure having identical or closely related resonance frequencies. Then a zone A can be observed of high reduction of the kinetic impedance Zem (FIG. 2) for a frequency range in which the displacement of the mobile assembly of the loudspeaker mounted in its enclosure is minimum (FIG. 3).

Figure 1:
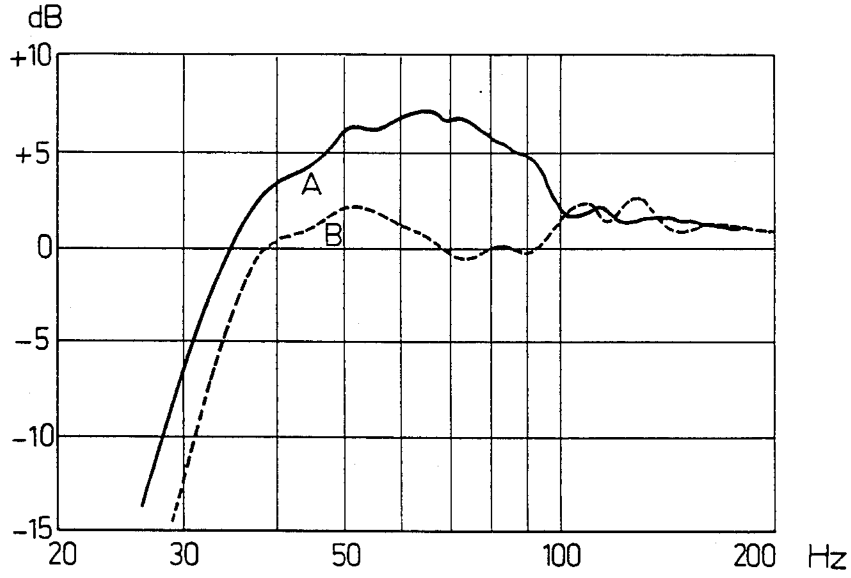
FIG. 1 shows a typical response curve of a resonating enclosure having a loudspeaker, without correction (curve A) and with correction using known techniques (curve B)
Figure 2:
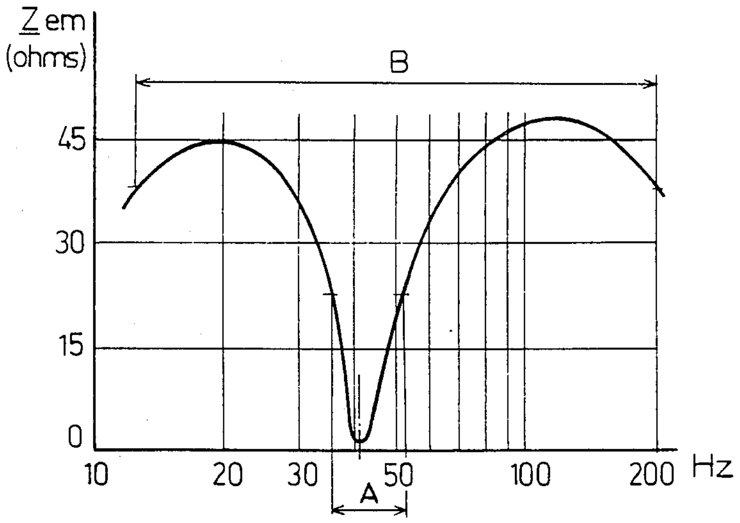
FIG. 2 shows the variation of the kinetic impedance of a transducer (LS+enclosure) for illustrating the overcoupling phenomenon between the LS and the enclosure (Zone A) used in the invention.
Figure 3:
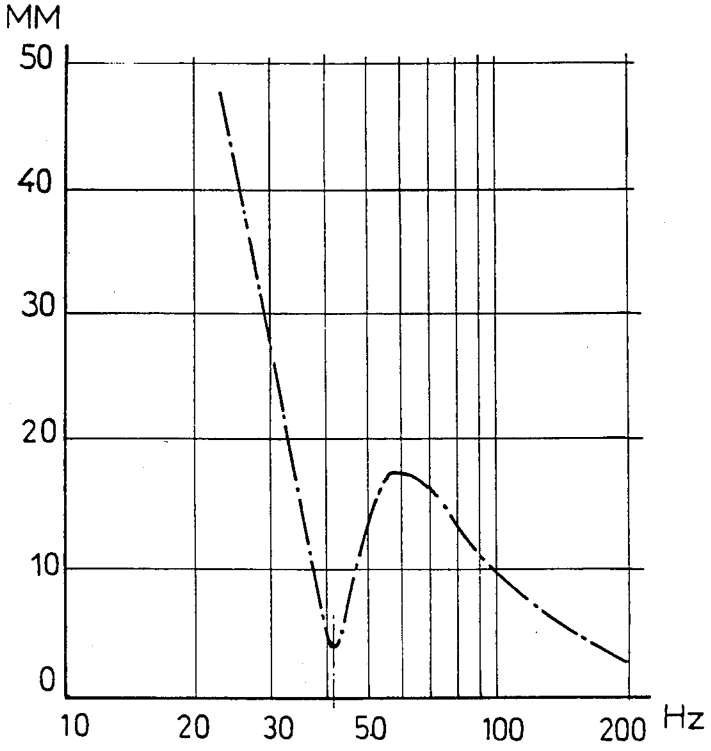
FIG. 3 illustrates the displacement of the mobile assembly of the loudspeaker mounted in its enclosure as a function of the frequency, in correspondence with FIG. 2.
Figure 4:
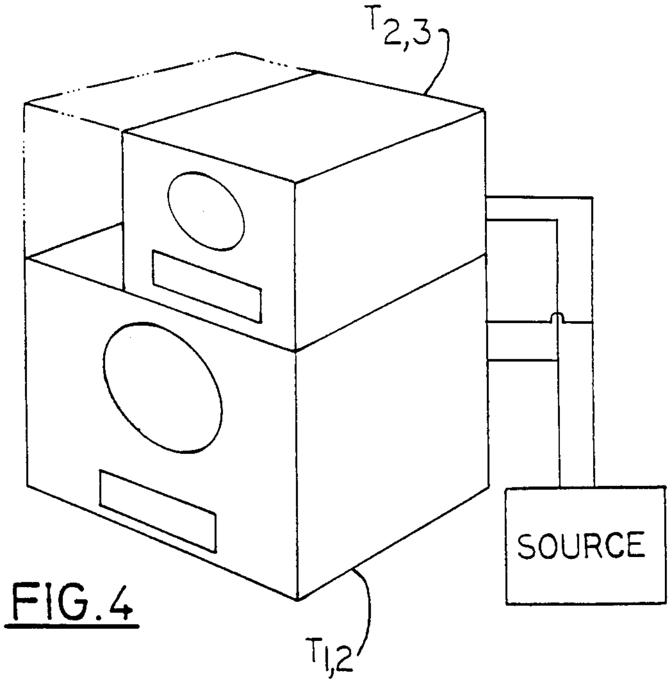
FIG. 4 shows a set of two transducers mounted in for reproducing the low frequency channel of a sound signal.

Because bf the preponderance of Zem, the minimum impedance zone A of the transducer corresponds approximately to zone A in FIG. 2. In the invention, this zone A will be chosen for defining the frequency range assigned to the corresponding transducer.

Figure 5:
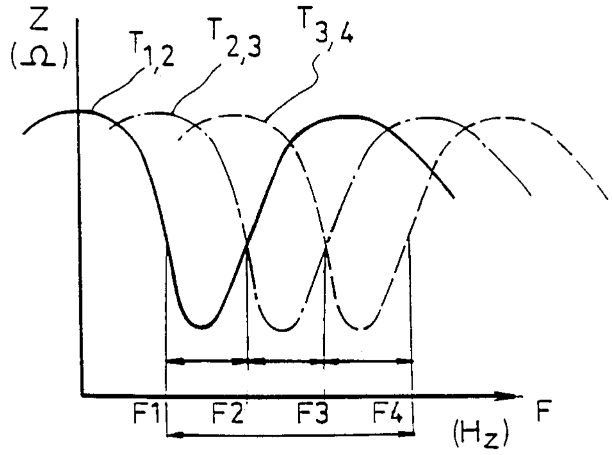
FIG. 5 illustrates the choice of the different transducers forming a complete set for restoring a sound spectrum in accordance with the invention as a function of their respective optimum operating zones.

The method of the invention applies preferably to low frequencies, because of the particular role played by Zem. But it is clear that any means for obtaining a minimum impedance zone A about any frequency remains within the scope of the invention. This condition is further not accompanied by any other requirement in so far as the regularity of the response curve of the transducer (loudspeaker+enclosure) is concerned, provided that the minimum impedance zone A is clearly distinguished.

the second condition is that the different transducers connected in parallel at the output of the electric modulation source have minimum impedance zones A which are compatible. This condition is illustrated in FIG. 5, showing the way in which the frequency spectrum between $F_1$ and $F_4$ is split up into three fractionation ranges of three interconnected transducers, is a function of their minimum impedance zone A.

For each frequency component f of the signal to be restored there exists a loudspeaker whose impedance Z at this frequency is minimum with respect to the other loudspeakers mounted directly in parallel. As a result, this component is preferably restored in this loudspeaker. More precisely, the transducer considered will take a preponderant fraction of current I and so will consume a preponderant fraction of the power P delivered by the electric source:

$$\langle P \rangle = Re\left(1/T \int_{O}^{T} ZI^{2}(t)\cdot dt\right) \quad (2)$$

$\langle P \rangle$ corresponding to the mean power consumed,

Re( . ) corresponding to the real part of . . . ; and

T corresponding to the period of the signal.

To permit this automatic selection of the frequencies may take place over the whole extend of the sound spectrum to be restored, it is necessary to fulfill two conditions:

the working frequency ranges $F_1$–$F_2$, $F_2$–$F_3$; $F_3$–$F_4$ of the parallel mounted transducers $T_{1,2}$, $T_{2,3}$, $T_{3,4}$ respectively must be juxtaposed so as to cover the whole of the spectrum $F_1$–$F_4$ of the sound signal to be restored, without prejudicial attentuation of any frequency of the signal; and the transducer assigned to each frequency range must have a lower impedance than the impedance offered in this range by all the other transducers of the complete set of transducers of the invention to provide the selectivity.

Advantageously, the frequency range $F_1$–$F_2$, $F_2$–$F_3$, and $F_3$–$F_4$ assigned to each transducer $T_{1,2}$, $T_{2,3}$, and $T_{3,4}$ is approximately centered about the frequency at which it has minimum impedance.

The invention can be constructed with four enclosures, each enclosure having a loudspeaker were mounted directly in parallel at the output of single modulation source.

The transducers can be chosen to selectively reproduce the following respective frequency bands: 31 to 40 Hz; 40 to 60 Hz; 60 to 85 Hz; 85 to 120 Hz.

Each of the transducers can be formed by an electrodynamic type loudspeaker, coupled to a Helmholtz resonating cavity, so that the resonance frequency of the loudspeaker and that of the resonating cavity are identical or closely related for each assembly.

The value of this resonance frequency was chosen, for each transducer, in the central zone of the frequency band which was assigned to it.

The following table reproduces the characteristics of each of the loudspeakers and of the corresponding cavity:

| | Transducers Resonance (Hz) | Band Reproduced (Hz) | Cavity Volume (l) | Vent without neck area ($dm^2$) |
|---|---|---|---|---|
| N°1 | 35 | 31 to 40 | 240 | 1.3 |
| N°2 | 48 | 40 to 60 | 130 | 1.4 |
| N°3 | 75 | 60 to 85 | 75 | 1.4 |
| N°4 | 105 | 85 to 120 | 25 | 1.5 |

The number of transducers mounted in parallel does not limit the invention.

Advantageously, however, the invention finds a preferred application in the restoration of low frequencies, less than 150 Hz. In fact, it is in this frequency range that most high fidelity problems are met with, particularly for restoring a high powered signal. In this respect, the method of the invention for improving the efficiency of electro-acoustic systems and specializing each transducer in a frequency range where it has a minimum impedance provides an optimum solution to these problems.

The invention has the advantage of no longer requiring the use of additional filtering or correction devices for fractionating the frequency of the signal to be restored in the different output transducers. However, it is clear that in some applications the method of the invention may be used in cooperation with electric or acoustic correction or filtering devices. It is also possible to use several power amplifiers in cooperation with the same set of transducers of the invention, the amplifiers working either over the whole of the frequency range of the signals to be reproduced or selectively over only a part of this range. The same amplifier may feed a single transducer or else several transducers of the set of transducers. Furthermore, the additional filtering or correction devices may be either inserted in or formed by the power amplifier or amplifiers placed directly upstream of the transducers.

The invention also has the advantage of regularizing the impedance curve of the complete transducer system by improving the amplifier/transducer system interface. In fact, whereas in the conventional system the load of the amplifier may vary in a ratio of 1:10 for restoring frequencies about the resonance frequency, the coupling of the transducer of the invention limits the load variations to a ratio of about 1 to 2 for the embodiment described.

Figure 6:
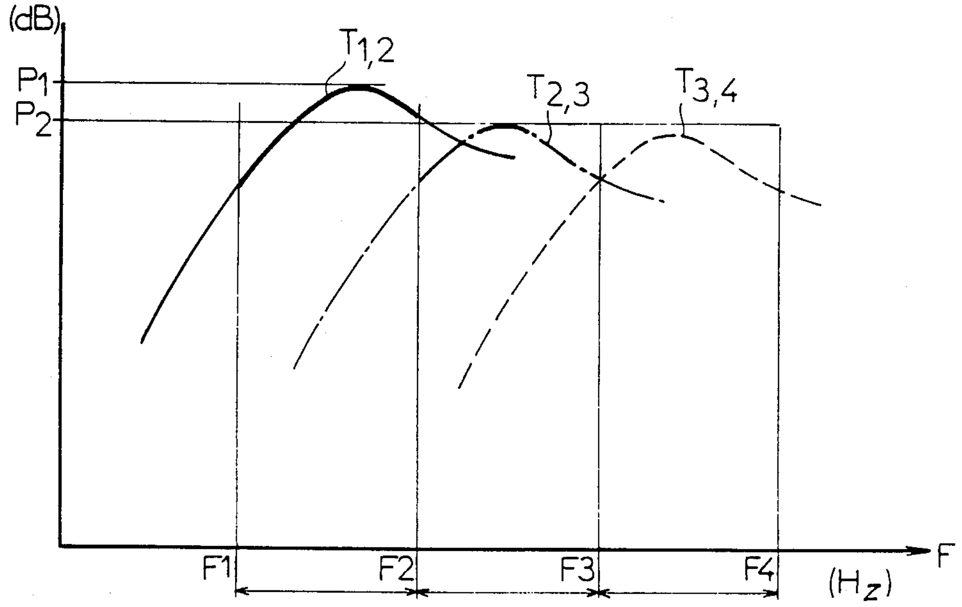
FIG. 6 illustrates the restoration levels of the sound signal at the output of each of the transducers of a complete set of transducers in accordance with the invention.

FIG. 6 illustrates schematically the output levels of the three associated transducers $T_{1,2}$, $T_{2,3}$, and $T_{3,4}$, as a function of the frequency.

It will be noted that the output sound levels correspond to a maximum, for each transducer, in the frequency zone which is assigned to it. In addition, the output sound levels must be defined so that they take into account level cumulation. More precisely, each frequency component f of the sound signal is restored essentially by the transducer of the corresponding frequency band. However, each transducer also restores, in an attenuated way, the components of the signal whose frequencies are outside its working range. The total restoration level of each component results then from the cumulation of its restoration by the whole of the transducers.

Consequently, in order to take this cumulation into account, the maximum output level $P_1$ of the transducer $T_{1,2}$, is greater than the output level, $P_2$ of the transducers $T_{2,3}$, and $T_{3,4}$. It is also possible to provide an even more precise adjustment, by associating a specific and different maximum level for each transducer $T_{1,2}$, $T_{2,3}$, and $T_{3,4}$, the difference of adjustment of each transducer being related to the disymmetry of each response curve. In all cases, the object is to adjust these maximum output sound levels of each transducer so as to obtain a cumulated level of restoration of the sound signal which is substantially constant over the whole frequency range of the signal.

The method of the invention has the essential advantage of using each transducer optimally in a working frequency zone where it cumulates several very positive properties:

minimum displacement of the mobile assembly and so low kinetic impedance;

maximum efficiency, for the power lost is minimum because each transducer operates under over-voltage with low impedance (close to what is called its "nominal impedance value", taken generally at 400 Hz or at 1000 Hz), in the working frequency zone;

natural selectivity effect, by automatically assigning each frequency essentially to the corresponding transducer.

What is claimed is:

1. A method for sound restoration from electric signals that have components in a given frequency range of acoustic frequencies that uses a set of electro-acoustic transducers that are formed by mounting at least one loudspeaker in a resonant enclosure and connecting it to an output of an electric source, said method comprising the steps of:

- distributing resonance frequencies of at least two loudspeakers along said frequency range at different resonance frequencies;
- mounting each loudspeaker in an enclosure that has approximately the same resonance frequency as the loudspeaker to form a transducer;
- overcoupling each of said transducers so that each loudspeaker and enclosure obtains a minimum impedance for said resonance frequency; and
- connecting said transducers in parallel across said source so that each transducer primarily restores a portion of said frequency range about its resonance frequency.

2. A method as claimed in claim 1, further comprising the step of tuning each transducer to center said portion of said frequency range approximately at a frequency that produces the minimum impedance.

3. A method as claimed in claim 1, further comprising the step of adjusting each transducer to have a lower impedance than the impedance offered along said portion of said frequency range by any other transducer of said set of transducers along said portion of said frequency range.

4. A method as claimed in claim 1, further comprising the step of adjusting each transducer to deliver a maximum output sound signal to its portion of said frequency range in addition to the output sound signals of the other transducers to provide a cumulated output sound signal that is approximately at a level that is the same as a level of cumulated output sound signals from other transducers distributed along said frequency range.

5. A method for sound restoration from electric signals that have components in a given range of acoustic frequencies less than 150 Hz that uses a set of electro-acoustic transducers formed by mounting at least one loudspeaker in a resonance enclosure for connection to an output of an electric source, said method comprising the steps of:

- distributing resonance frequencies of at least two loudspeakers along said frequency range at different resonance frequencies;
- mounting each loudspeaker in an enclosure that has approximately the same resonance frequency as the loudspeaker to form a transducer;
- overcoupling each of said transducers so that each loudspeaker and enclosure obtains a minimum kinetic impedance for said resonance frequency; and
- connecting said transducers in parallel across said source so that each transducer primarily restores a portion of said frequency range abouts its resonant frequency.

6. A method as claimed in claim 5, further comprising the step of tuning each transducer to center said portion of said frequency range approximately at a frequency that produces minimm kinetic impedance.

7. A method as claimed in claim 5, further comprising the step of adjusting each transducer to have a lower kinetic impedance than the kinetic impedance offered along said portion of said frequency range by any other transducer of said set of transducers along said portion of said frequency range.

8. A method as claimed in claim 5, further comprising the step of adjusting each transducer to deliver a maximum output sound signal in its portion of said frequency range in addition to the output sound signals of the other trnasducers to provide a cumulated output sound signal that is approximately at a level that is the same as a level of cumulated output sound signals from other transducers distributed along said frequency range.

9. A set of transducers for sound restoration from electric signals that have components in a given range of acoustic frequencies using a set of electro-acoustic transducers formed by mounting at least one loudspeaker in a resonance enclosure for connection to an output of an electric source, said set of transducers comprising:

- at least two loudspeakers that have different resonance frequencies distributed along said frequency range;
- an enclosure for mounting each loudspeaker, each such enclosure having a resonance frequency that is approximately the same as its associated loudspeaker, the loudspeaker being overcoupled with the enclosure to obtain a transducer which has a minimum impedance at said resonance frequency; and
- means for connecting said transducers in parallel across said electric source so that each transducer primarily restores a portion of said frequency range about its resonance frequency.

10. A set of transducers as claimed in claim 9, wherein each transducer comprises at least one loudspeaker closely coupled to a resonance cavity, said loudspeaker and resonance cavity being in said portion of said frequency range assigned to said transducer.

11. A set of transducers as claimed in claim 9, wherein each transducer comprises at least one electrodynamic loudspeaker mounted in a Helmholtz resonant cavity.

12. A set of transducers as claimed in claim 9, wherein said transducers restore sounds having frequencies less than 150 Hz.

13. A set of transducers for sound restoration from electric signals that have components in a given range of acoustic frequencies less than about 150 Hz using a set of electro-acoustic transducers formed by mounting at least one loudspeaker in a resonance enclosure for connection to an output of an electric source, said set of transducers comprising:

at least two loudspeakers that have different resonance frequencies distributed along said frequency range;

an enclosure for mounting each loudspeaker, each such enclosure having a resonance frequency that is approximately the same as its associated loudspeaker, the loudspeaker being overcoupled with the enclosure to obtain a transducer which has a minimum kinetic impedance at said resonance frequency; and means for connecting said transducers in parallel across said electric source so that each transducer primarily restores mainly a portion of said frequency range about its resonance frequency.

14. A set of transducers as claimed in claim 13, wherein each transducer comprise at least one loudspeaker closely coupled to a resonance cavity, said loudspeaker and resonant cavity being chosen to form at least one module assembly having a minimum displacement in said portion of said frequency range assigned to said transducer.

15. A set of transducers as claimed in claim 13, wherein each transducer comprises at least one electrodynamic loudspeaker mounted in a Helmholtz resonance cavity.

* * * * *